US006683481B1

(12) United States Patent
Zhou et al.

(10) Patent No.: US 6,683,481 B1
(45) Date of Patent: Jan. 27, 2004

(54) POWER ON RESET GENERATOR CIRCUIT PROVIDING HYSTERESIS IN A NOISY POWER ENVIRONMENT

(75) Inventors: Shi-dong Zhou, Milpitas, CA (US); Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 2 days.

(21) Appl. No.: 10/162,236

(22) Filed: Jun. 3, 2002

(51) Int. Cl.[7] .................................................. H03L 7/00
(52) U.S. Cl. ...................................................... 327/143
(58) Field of Search ................................. 327/142, 143, 327/198

(56) References Cited

U.S. PATENT DOCUMENTS 5,485,111 A * 1/1996 Tanimoto .................... 327/143
5,629,642 A * 5/1997 Yoshimura .................. 327/142
5,867,047 A * 2/1999 Kraus ......................... 327/143
5,929,674 A * 7/1999 Maccarrone et al. ........ 327/143

* cited by examiner

Primary Examiner—Jeffrey Zweizig
(74) Attorney, Agent, or Firm—Lois D. Cartier (57) ABSTRACT

A power on reset (POR) generator circuit includes a modified bandgap POR circuit in series with a modified RC POR circuit. During a fast or slow power up, the circuit behaves like a traditional bandgap POR circuit, providing a POR signal when the voltage on an internal node rises higher than a reference voltage. During a fast power up, the capacitor on the bandgap output signal ensures that the POR signal remains active long enough to reset the associated circuitry. During a slow power up, the capacitor prevents glitches in the bandgap output from being passed to the POR output signal. A feedback pulldown optionally included in the bandgap portion of the circuit helps to prevent glitches from reaching the POR output signal by raising the voltage on the internal node after the reference voltage is exceeded. Various embodiments include programmable logic devices and systems that include the described circuits.

27 Claims, 8 Drawing Sheets

FIG. 6

POWER ON RESET GENERATOR CIRCUIT PROVIDING HYSTERESIS IN A NOISY POWER ENVIRONMENT

FIELD OF THE INVENTION

The invention relates to Programmable Logic Devices (PLDs). More particularly, the invention relates to a power on reset circuit for a PLD that provides hysteresis in a noisy power environment.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g. DLLs, RAM, and so forth).

The CLBs, IOBs, interconnect, and other logic blocks are typically programmed by loading a stream of configuration data into internal configuration memory cells that define how the CLBs, IOBs, and interconnect are configured. The configuration data can be read from memory (e.g., an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory, then downloaded to volatile memory as part of an initial configuration sequence.

In each of these PLDs, the functionality of the device is controlled by data bits provided to the device for that purpose. The data bits can be stored in volatile memory (e.g., static RAM cells, as in FPGAs and some CPLDs), in non-volatile memory (e.g., FLASH memory or E-squared memory, as in some CPLDs), or in any other type of memory cell.

Every PLD, whatever its type, must at some point be "powered up", i.e., awakened from a zero power state to a point at which the power high voltage VDD reaches an acceptable operating voltage level. The power up reset sequence resets the PLD so the device will function properly. For example, during the power up reset sequence, the input/output (I/O) pins of the PLD are preferably tristated (i.e., no signal is applied to the output pins by the PLD logic), the internal memory cells are initialized, and a configuration state machine is initialized and made ready to configure the part with the configuration data provided to the device.

Once the power high voltage VDD is high enough for the transistors of the device to operate properly, the configuration state machine takes control of the configuration process and begins loading configuration data into the volatile memory cells. When all of the data has been loaded, the I/O pins are enabled, and the device is ready to begin performing its programmed functions.

Another reset process takes place when a device is powered down, i.e., the power high voltage VDD is brought from the operating voltage level back down to the zero power state (or below a triggering voltage level). During the power down reset sequence, the PLD detects that the power high voltage VDD has reached or is nearing an unacceptably low level and performs a sequence of operations such as saving current state information, informing other integrated circuits (ICs) to stop sending data to the PLD, and so forth.

The power up and power down reset procedures are complicated by the fact that power supplies can be "noisy", i.e., glitching significantly above and/or below the nominal voltage level. For example, during the power up sequence, VDD can rise above the acceptable level and then fall below this level one or more times before reaching the final operating voltage. Additionally, once at the operating voltage, VDD can glitch to below a power down triggering voltage. Similarly, during the power down sequence, VDD can fall below the acceptable level and then rise back above this level one or more times before reaching the zero power level. Therefore, it is desirable to provide hysteresis (i.e., protection against transmitting such glitches) to circuitry that controls the power-related reset functions in a PLD.

Figure 1:
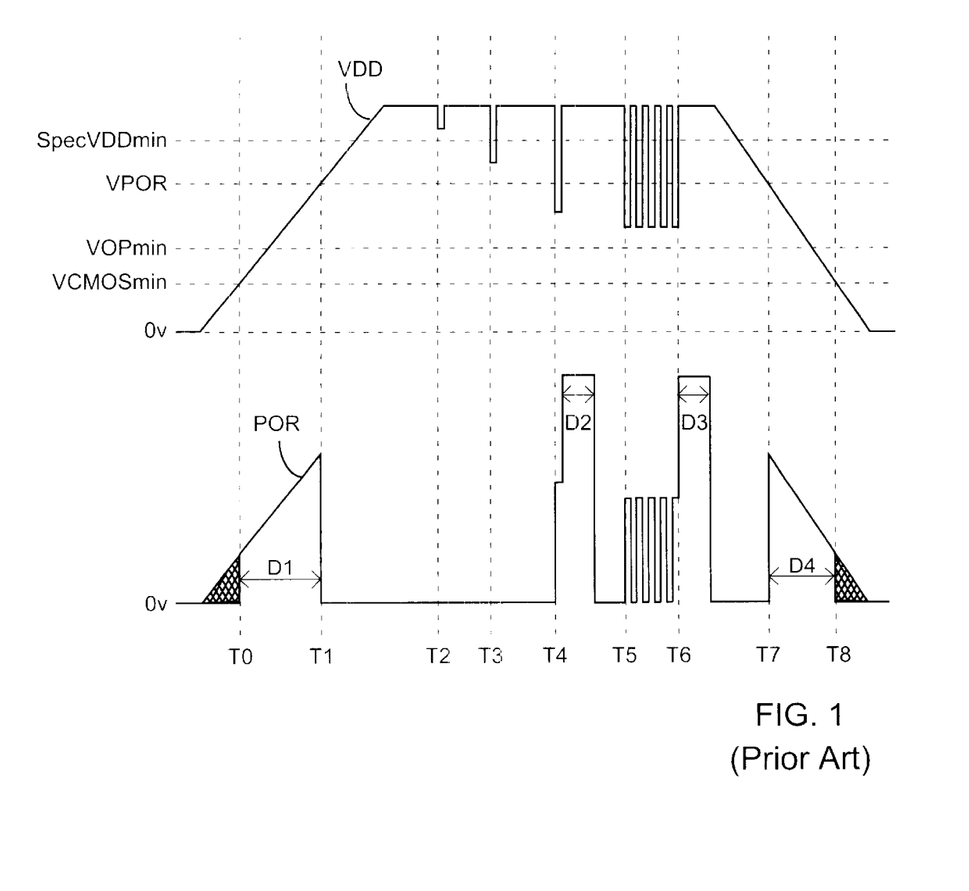
FIG. 1 shows the waveforms for power high VDD and an active-high power on reset signal in a noisy power environment.

FIG. 1 shows exemplary power up and power down voltage levels for VDD and corresponding voltage levels on a power on reset signal called POR. When signal POR is high, the device undergoes a reset process as described above. Note that in this example the POR signal is active-high, although power on reset signals can be either active-high or active-low. When used as a signal name herein, the name "POR" indicates an active-high signal, while the name "PORB" is used for an active-low signal. However, when used as an adjective, the acronym POR is simply used as an abbreviated form of the phrase "power on reset".

As shown in FIG. 1, when VDD begins to ramp up from the zero volt power level, VDD first reaches a level called VCMOSmin (time T0). VCMOSmin is the minimum power high level at which CMOS logic will function. At the VCMOSmin power level, the POR signal changes to a high value and the PLD enters reset mode. Because the power to the POR signal generator is provided by VDD, the voltage level of POR tracks VDD and does not exceed VDD at any given time.

The voltage level of VDD (and the POR signal) rises past the voltage level VOPmin, which is the minimum voltage at which all of the PLD circuitry will operate. Because not all of the logic in the PLD is digital CMOS logic, VOPmin is higher than VCMOSmin. VDD and POR then continue to rise to the voltage level called VPOR (time T1). At voltage level VPOR, the PLD is considered to be successfully reset and the POR signal is removed (i.e., the active-high signal POR goes low again). The PLD loads the configuration data from non-volatile memory, then enters user mode, i.e., begins to performs its programmed functions. The applied voltage VDD continues to rise until it passes the specified minimum operating voltage, SpecVDDmin.

FIG. 1 also shows the consequences of glitches on the VDD power level. If VDD glitches down while the PLD is in operating mode, but does not fall below the VPOR voltage level (e.g., at times T2 and T3), the power on reset circuitry is not affected and the PLD continues to operate in user mode. If VDD glitches below the VPOR voltage level, as at time T4, the POR signal is forced high and the PLD goes through the reset sequence again.

The POR signal must remain high long enough for the power on reset sequence to be successfully concluded. In the example of FIG. 1, duration D1 between times T0 and T1 is long enough to complete the reset sequence. Similarly, duration D2 after time. T4 is long enough to complete the reset sequence. However, after time T5 there are several glitches that restart the reset sequence repeatedly until (after time T6) there is finally a duration D3 that is sufficient to successfully reset the PLD.

At time T7, the VDD power high voltage level falls below the VPOR power level, and signal POR is driven high. The power down reset sequence is initiated. Signal POR then follows power high VDD down to below the VCMOSmin power level (time T8), at which point signal POR goes low again. Note that in the example of FIG. 1 the triggering voltages for both rising and falling power levels are the same (VPOR). These power levels can be the same or different from each other.

A noisy power environment is a greater problem for PLD designers and users than was previously the case, because PLD operating voltages are lower than they used to be. Thus, the difference between the operating voltage and the threshold voltage of an N-channel transistor, for example, is decreasing. A "glitch" that can inadvertently change the state of a memory cell, for example, can more easily occur with a lower operating voltage. Threshold voltages are also decreasing, which means that a minor change to the input voltage level of a transistor can undesirably change the state of the transistor.

Power high VDD can ramp up quickly or slowly, in a period of time ranging from a few microseconds to as much as several seconds. While PLD manufacturers generally specify a minimum VDD ramp rate, a slower ramp rate is desirable in some applications. In other applications, VDD ramps up in a staircase fashion, with intervals of rising power levels alternating with intervals where the power level remains flat. When VDD ramps up very slowly or in staircase fashion, existing PLDs may not reset properly. Further, current consumption can be very high during these slow reset processes. As a result of this high current consumption, the VDD ramp up is further slowed, and can even stop altogether, such that the device never enters the user mode.

Clearly, it is desirable to provide power on reset circuitry that generates a clean (glitch-free) POR signal in a noisy power environment. It is also desirable to provide power on reset circuitry that performs this function over a wide range of temperatures, process corners, and rising and falling VDD ramp rates.

SUMMARY OF THE INVENTION

The invention provides a power on reset (POR) generator circuit that is very stable over a wide range of power up and power down situations. The circuit of the invention includes a modified bandgap POR circuit in series with a modified RC POR circuit.

During a fast or a slow power up, the circuit of the invention behaves like a traditional bandgap POR circuit, providing a POR signal when the voltage on an internal node rises higher than a reference voltage level. However, the circuit of the invention also provides a capacitor on the bandgap output signal (from the modified RC POR circuit coupled in series with the bandgap output signal). During a fast power up, the capacitor ensures that the POR signal remains active long enough to reset the associated circuitry. During a slow power up, the capacitor prevents glitches in the bandgap output signal from being passed to the POR output signal. A feedback pulldown optionally included in the bandgap portion of the circuit also helps to prevent glitches from reaching the POR output signal by increasing the voltage level on the internal node after the reference voltage is exceeded.

When the power up ramp rate is in the intermediate range, conventional POR circuits sometimes do not issue a POR pulse at all, depending on the size of the capacitor. Because of the series configuration of the two sub-circuits, the present invention is not subject to this limitation.

According to one embodiment of the invention, a power on reset (POR) generator circuit includes a reference voltage input terminal, a bandgap POR circuit having an input terminal coupled to the reference voltage input terminal, and an RC POR circuit having an input terminal coupled to an output terminal of the bandgap POR circuit. An output terminal of the RC POR circuit is coupled to a POR output terminal of the POR generator circuit. One embodiment of the invention also includes a reference voltage generator circuit driving the reference voltage input terminal of the POR generator circuits.

According to one embodiment, the bandgap POR circuit includes a comparator circuit and two resistive elements coupled in series between power high VDD and ground. The comparator circuit has a first input terminal coupled to the reference voltage input terminal, a second input terminal coupled to a first node between the two resistive elements, and an output terminal coupled to the output terminal of the bandgap POR circuit.

Some embodiments also include a third resistive element coupled between the second resistive element and ground. A pulldown circuit is coupled to a second node between the second and third resistive elements, and a control terminal of the pulldown circuit is coupled to the output terminal of the comparator circuit.

According to one embodiment, the RC POR circuit includes a third node, a resistor coupled between the output terminal of the bandgap POR circuit and the third node, a capacitor coupled between the third node and ground, and a buffer driven by the third node and providing a POR output signal to the output terminal of the RC POR circuit.

Another embodiment of the invention provides a programmable logic device (PLD) that includes a configuration memory array, a configuration state machine, a power high VDD input terminal, and a power on reset (POR) generator circuit. The POR generator circuit provides a POR output signal to POR input terminals of the configuration memory array and the configuration state machine. The POR generator circuit is substantially as described above.

In some embodiments, the configuration memory array includes a volatile memory array and a non-volatile memory array, each having a POR input terminal coupled to the POR output terminal of the POR generator circuit. Various other embodiments include other circuits having input terminals coupled to the POR output terminal of the POR generator circuit. These circuits can include, for example, flip-flops and latches, input/output logic blocks, default logic functions and paths, and/or an off-chip communications circuit.

Some embodiments of the invention provide a system that includes an integrated circuit (IC) having a POR input terminal, and a PLD that drives the POR input terminal. The PLD includes a configuration memory array, a configuration state machine, a power high VDD input terminal, and a POR generator circuit. The POR generator circuit provides a POR output signal to POR input terminals of the configuration memory array, the configuration state machine, and the IC. The POR generator circuit can be, for example, substantially as described above.

According to one embodiment, the PLD includes an off-chip communication circuit having an input terminal coupled to the POR output terminal of the POR generator circuit and also having a "ready" output terminal. The ready output terminal is coupled to a ready input terminal of the IC. In some embodiments, the PLD includes other elements coupled to receive the POR signal, such as those described above.

DETAILED DESCRIPTION OF THE DRAWINGS

The present invention is believed to be applicable to a variety of integrated circuits (ICs) and systems. However, the present invention has been found to be particularly applicable and beneficial for PLDs. Therefore, an appreciation of the present invention is presented by way of specific examples that describe POR circuits for PLDs. However, no such limitation applies to the circuits and systems of the invention.

Figure 2:
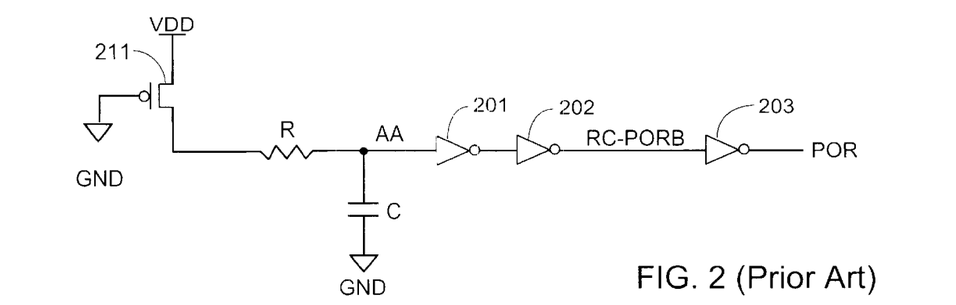
FIG. 2 shows a conventional RC POR circuit.

FIG. 2 shows a well known POR circuit that uses an RC structure to regulate the output signal. Essentially, as power high VDD ramps up to a predetermined level, the value on output terminal POR also rises (similar to signal POR in FIG. 1). However, as VDD continues to rise, capacitor C stores a charge. When the charge gets high enough, the charge stored in the capacitor drives signal POR low (inactive) again.

The RC POR circuit of FIG. 2 includes a pullup 211, a resistor R, a capacitor C, and inverters 201–203. The number of inverters on the output path varies according to whether an active-low or active-high output signal is desired. In the pictured circuit, a high value on the output signal POR resets the associated circuits.

Pullup 211 (a P-channel transistor with a gate terminal coupled to ground GND), resistor R, and capacitor C are coupled in series between power high VDD and ground GND. The node AA between resistor R and capacitor C also drives inverter 201. The output of inverter 201 is inverted by inverter 202 to provide signal RC-PORB. (In the present specification, the same reference characters are used to refer to terminals, signal lines, and their corresponding signals.) Signal RC-PORB can optionally be used as an active-low POR signal. Signal RC-PORB is optionally inverted by inverter 203 to provide active-high output signal POR.

Figure 2A:
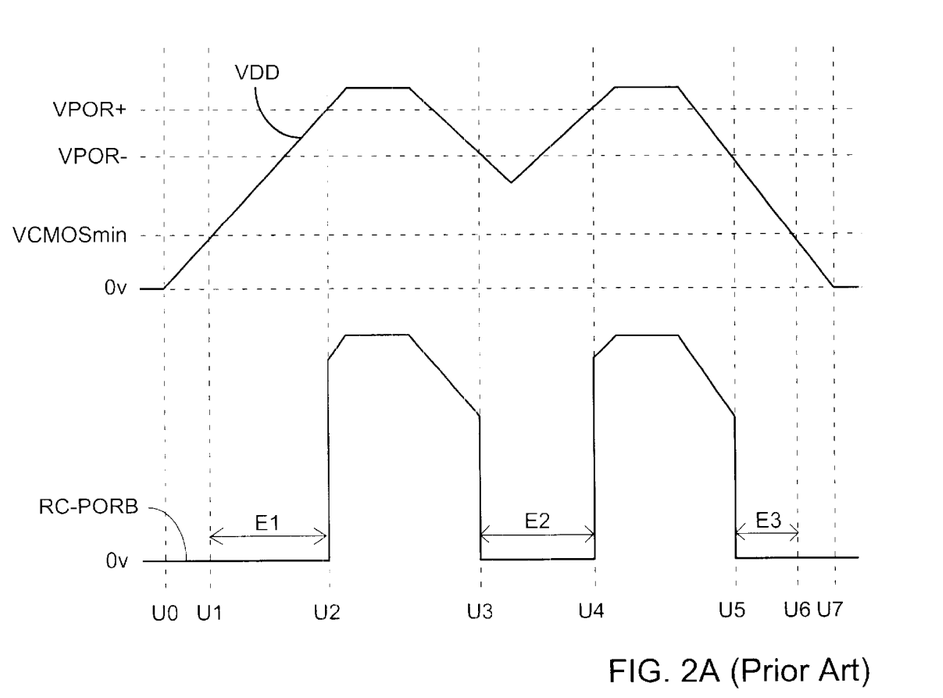
FIG. 2A shows the waveforms for power high VDD and an active-low power on reset signal for the RC POR circuit of FIG. 2.

FIG. 2A shows how the circuit of FIG. 2 generates a POR output signal. Signal RC-PORB is illustrated as a separate waveform below the VDD signal. Power high VDD begins to rise at time U0. At time U1, VDD rises past the point (VCMOSmin) when the RC POR circuit begins to function. When VDD rises past the VPOR+ voltage level at time U2, signal RC-PORB goes high (inactive). Thus, for the circuit to reset properly, duration E1 between times U1 and U2 needs to be at least as long as the power up reset sequence.

Figure 2B:
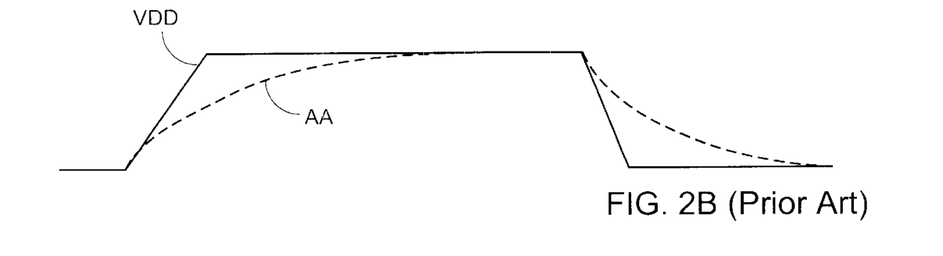
FIG. 2B shows the waveform for node AA of FIG. 2.

When VDD falls back past the VPOR– voltage level (time U3), signal RC-PORB goes low again. Note that in the example of FIG. 2A, the rising POR voltage VPOR+ is different from the falling POR voltage VPOR–. This difference is typical, and is due to the difference between the charging and discharging times of capacitor C. FIG. 2B shows how the voltage level of node AA changes in response to the rising and falling VDD. Because of capacitor C, node AA does not track with VDD, but lags both rising and falling. The time at which rising POR voltage VPOR+ is reached depends on how long it takes to charge up capacitor C. The time at which falling POR voltage VPOR– is reached depends on how long it takes to discharge capacitor C. Clearly, these two times can vary significantly with temperature, variations in IC fabrication (process corners), and the ramp up/down times of power high VDD.

To ensure that durations E1, E2, and E3 are long enough to perform the entire reset sequences, capacitor C is typically made very large. However, this large capacitor makes the PLD very slow to "wake up" for configuration.

The circuit of FIG. 2 works well when the power up and power down rates for VDD are intermediate (e.g., in the microsecond range) or fast (e.g., a few nanoseconds). However, the circuit of FIG. 2 does not work when VDD ramps up slowly (e.g., milliseconds) or very slowly (e.g., seconds), or when the power up has a stair-step configuration. In a slow power up situation, capacitor C has plenty of time to store charge. Even at a low VDD level, the stored charge is sufficient to drive signal POR low before the power up reset sequence is completed.

Figure 3:
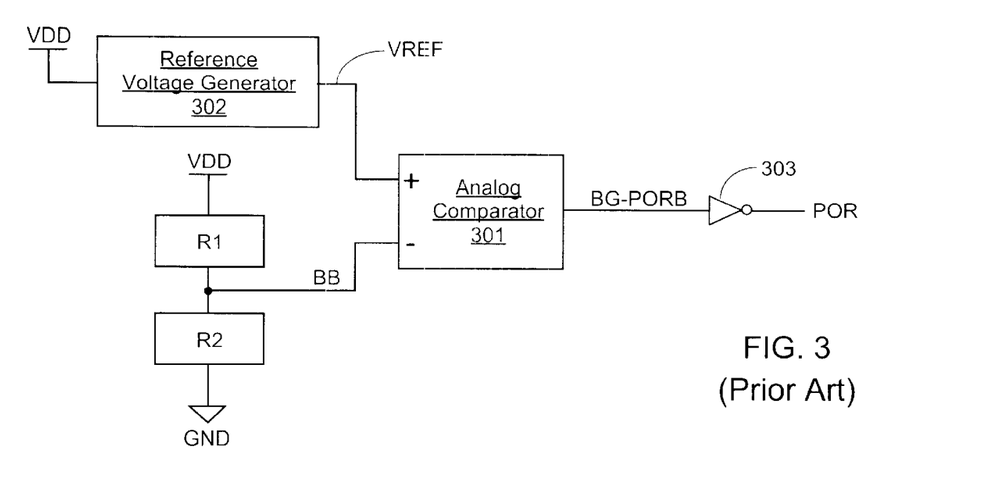
FIG. 3 shows a conventional bandgap POR circuit.

FIG. 3 shows a well known POR circuit called a bandgap circuit that functions well with a slow power up ramp. Essentially, an analog comparator compares the VDD voltage level (divided down using a resistor network) to a reference voltage. As power high VDD ramps up to a predetermined level, the value on output terminal POR also rises. When the divided VDD voltage rises above the reference voltage, the comparator drives output signal POR low (inactive) again.

The circuit of FIG. 3 includes an analog comparator 301 having positive and negative input terminals. A reference voltage generator 302 supplies a reference voltage VREF (derived from VDD) to the positive input terminal. A voltage divider including resistors R1 and R2 is used to divide down power high VDD, and provide a predetermined fraction of the VDD voltage level (i.e., the voltage at node BB) to the negative input terminal of comparator 301. The voltage at node BB is [R2/(R1+R2)]*VDD, or the ratio of R2 to (R1 plus R2) multiplied by VDD.

Comparator 301 provides active-low POR output signal BG-PORB, which can optionally be used as an active-low POR signal. Signal BG-PORB is optionally inverted by inverter 303 to provide the active-high output signal POR.

Figure 3A:
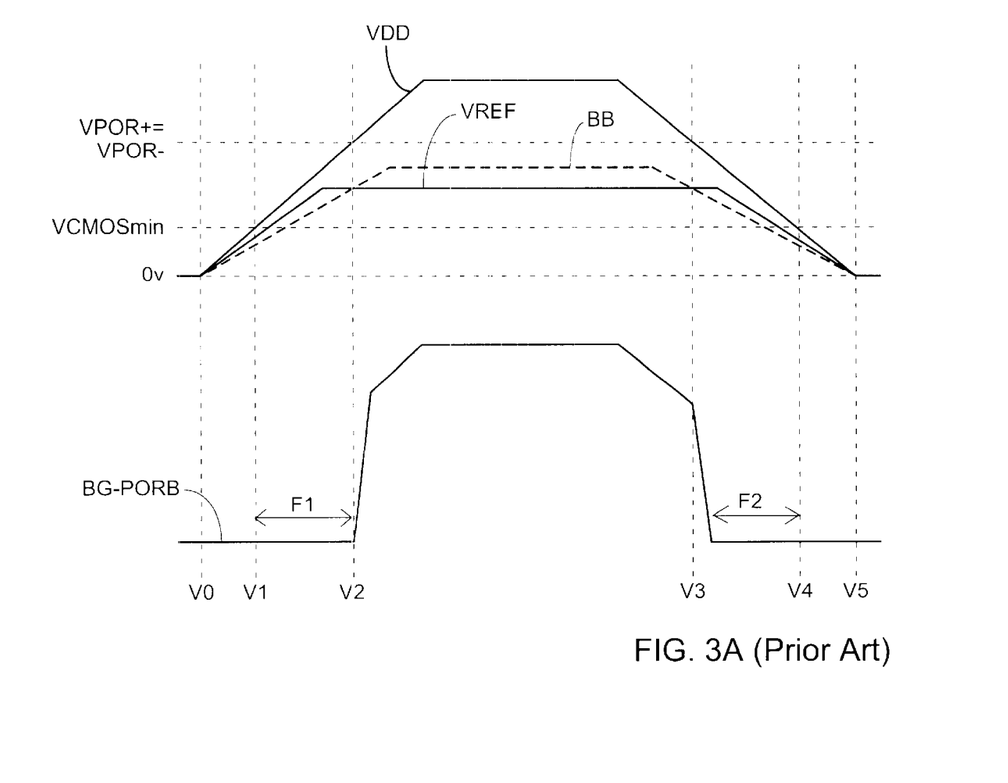
FIG. 3A shows the waveforms for power high VDD and an active-low power on reset signal for the bandgap POR circuit of FIG. 3.

FIG. 3A shows how the circuit of FIG. 3 generates a POR output signal. Signal BG-PORB is illustrated as a separate waveform below the VDD, VREF, and BB signals. Note that node BB tracks power high VDD, but is reduced by a predetermined ratio. Reference voltage VREF also tracks VDD, but with a lower ramp rate and a lower maximum voltage.

Power high VDD begins to rise at time V0, tracked by node BB and reference voltage VREF. At time V1, VDD rises past the point (VCMOSmin) when the bandgap POR circuit begins to function. When node BB rises past the reference voltage level VREF at time V2, signal BG-PORB goes high (inactive). Thus, for the circuit to reset properly, duration F1 between times V1 and V2 needs to be at least as long as the power up reset sequence. When node BB falls back past the VREF reference voltage level, signal BG-PORB goes low again.

Note that in the example of FIG. 3A, the rising POR voltage VPOR+ is the same as the falling POR voltage VPOR−. This is because the POR voltage, rising or falling, depends on a digital output signal from comparator 301, not on the charging and discharging of a large capacitor.

The reference voltage supplied by reference voltage generator 302 is quite stable over all temperatures and process corners. However, voltage generator 302 only functions properly when the power high voltage VDD is higher than a predetermined value, e.g., 1.2 volts. When first powered up, the reference voltage provided can be unpredictable for a certain period of time. Therefore, in a fast power up situation, the reference voltage does not always have time to settle to a steady value before the POR output signal goes high (inactive).

Because of this limitation, the bandgap POR circuit does not work well in intermediate (e.g., microseconds) or fast (e.g., nanoseconds) power up situations.

Figure 4:
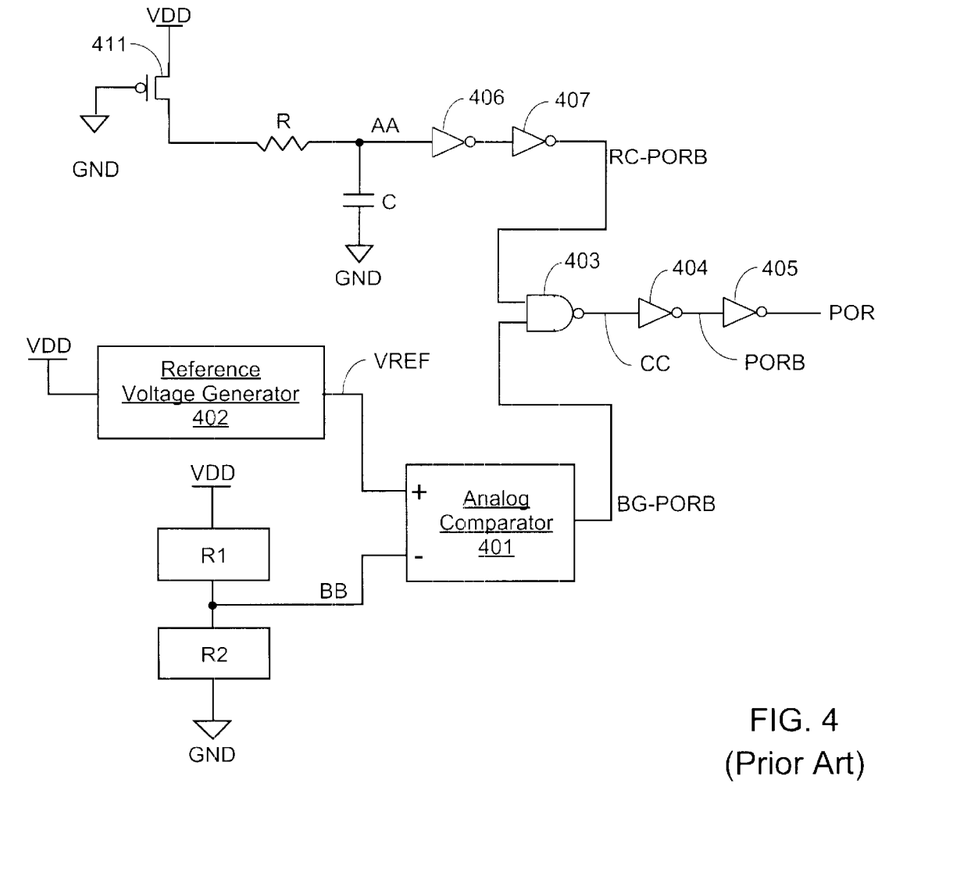
FIG. 4 shows another conventional POR generator circuit that combines the RC and bandgap techniques of FIGS. 2 and 3.

In order to achieve the full range from very fast to very slow ramp up rates, IC designers have combined the two types of POR circuits as shown in FIG. 4. The RC and bandgap POR circuits are essentially coupled in parallel. At faster ramp up rates, the RC POR circuit provides an active POR signal. At slower ramp rates, the bandgap POR circuit provides the active POR signal.

The POR generator circuit of FIG. 4 includes a pullup 411, a resistor R, a capacitor C, and inverters 406–407. These elements form an RC POR circuit similar to those of FIG. 2 and provide signal RC-PORB. Also included are an analog comparator 401, a reference voltage generator 402, and a voltage divider including resistors R1 and R2. These elements form a bandgap POR circuit similar to that shown in FIG. 3 and provide signal BG-PORB. Signals RC-PORB and BG-PORB are combined in NAND gate 403 to provide signal CC. Signal CC is inverted in inverter 404 to provide active-low POR signal PORB. Signal PORB is optionally inverted in inverter 405 to provide active-high POR signal POR.

At the faster ramp up rates, the RC POR portion of the circuit does not have time to charge up capacitor C, so signal RC-PORB is initially low, driving signal POR high through NAND gate 403, inverter 404, and inverter 405. By the time capacitor C is charged and signal RC-PORB goes high, enough time has usually elapsed (if capacitor C is large enough) to complete the power up reset sequence. Only when both of RC-PORB and BG-PORB are high does the POR output signal POR go low (inactive) again.

However, the circuit of FIG. 4 does not work as well at the slower ramp rates when faced with noisy power supply conditions. As described above, at the slower ramp rates, capacitor C becomes fully charged before the power up reset sequence is complete. When capacitor C is fully charged, signal RC-PORB is essentially at VDD. Thus, the circuit of FIG. 4 is essentially equivalent to the circuit shown in FIG. 3.

Figure 4A:
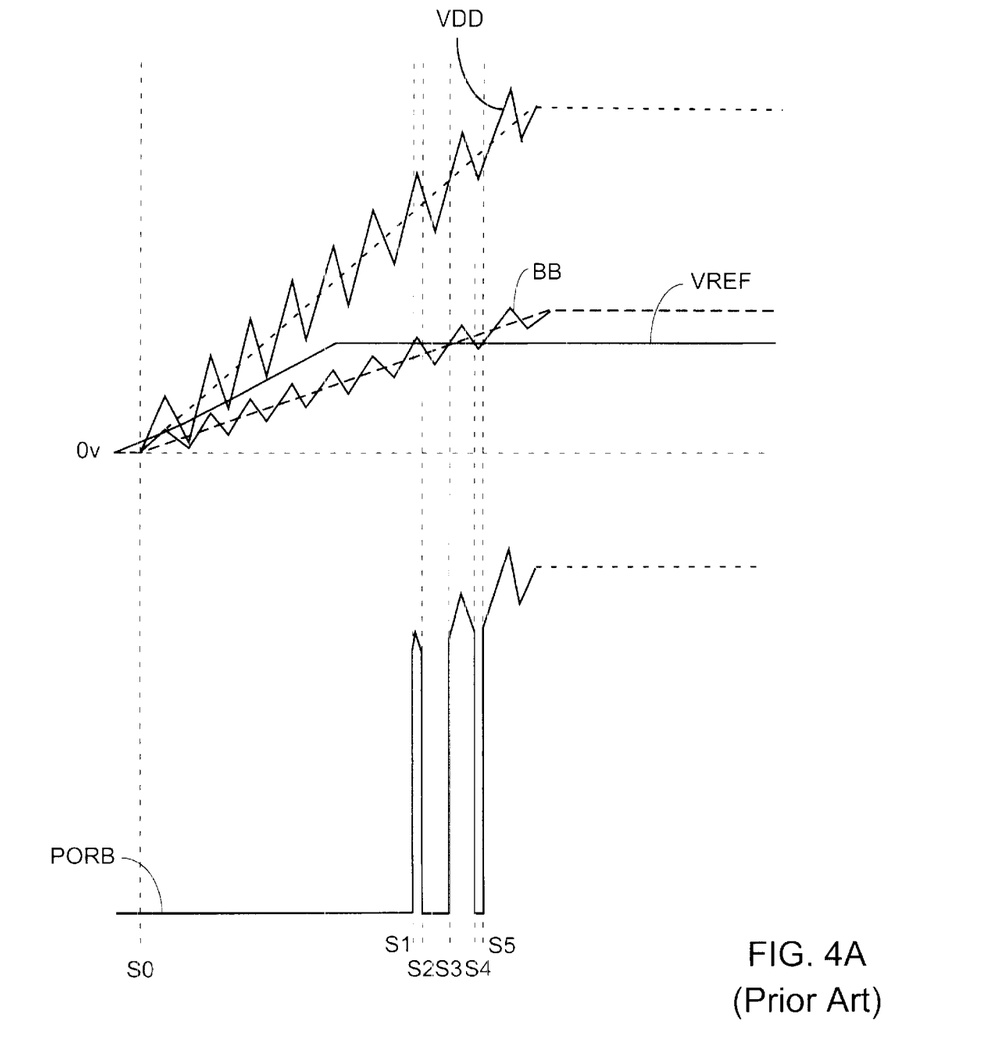
FIG. 4A shows the waveforms for power high VDD and an active-low power on reset signal in a noisy power environment, when applying a slow ramp rate to the circuit of FIG. 4.

At slower ramp rates, power high VDD can be very noisy, as shown in FIG. 4A. The nominal curves for VDD and node BB (the divided down version of VDD) are shown as dotted lines in FIG. 4A. However, when power high VDD is noisy, the waveforms of VDD and BB more nearly resemble the jagged forms shown in FIG. 4A. Reference VREF, on the other hand, remains stable even when node VDD is noisy.

As can be seen in FIG. 4A, a noisy signal BB crossing a stable reference voltage VREF can repeatedly stimulate the active-low POR signal PORB. In the pictured example, the initial duration between times S0 and S1 should be sufficient to complete the power up reset sequence. However, additional pulses on signal PORB are created by the noisy signal BB crossing back and forth over the VREF line, e.g., starting at times S2 and S4. These pulses might not be of sufficient duration to complete the power up reset sequence. Thus, in a noisy power environment the associated circuits might never be successfully reset.

Figure 5:
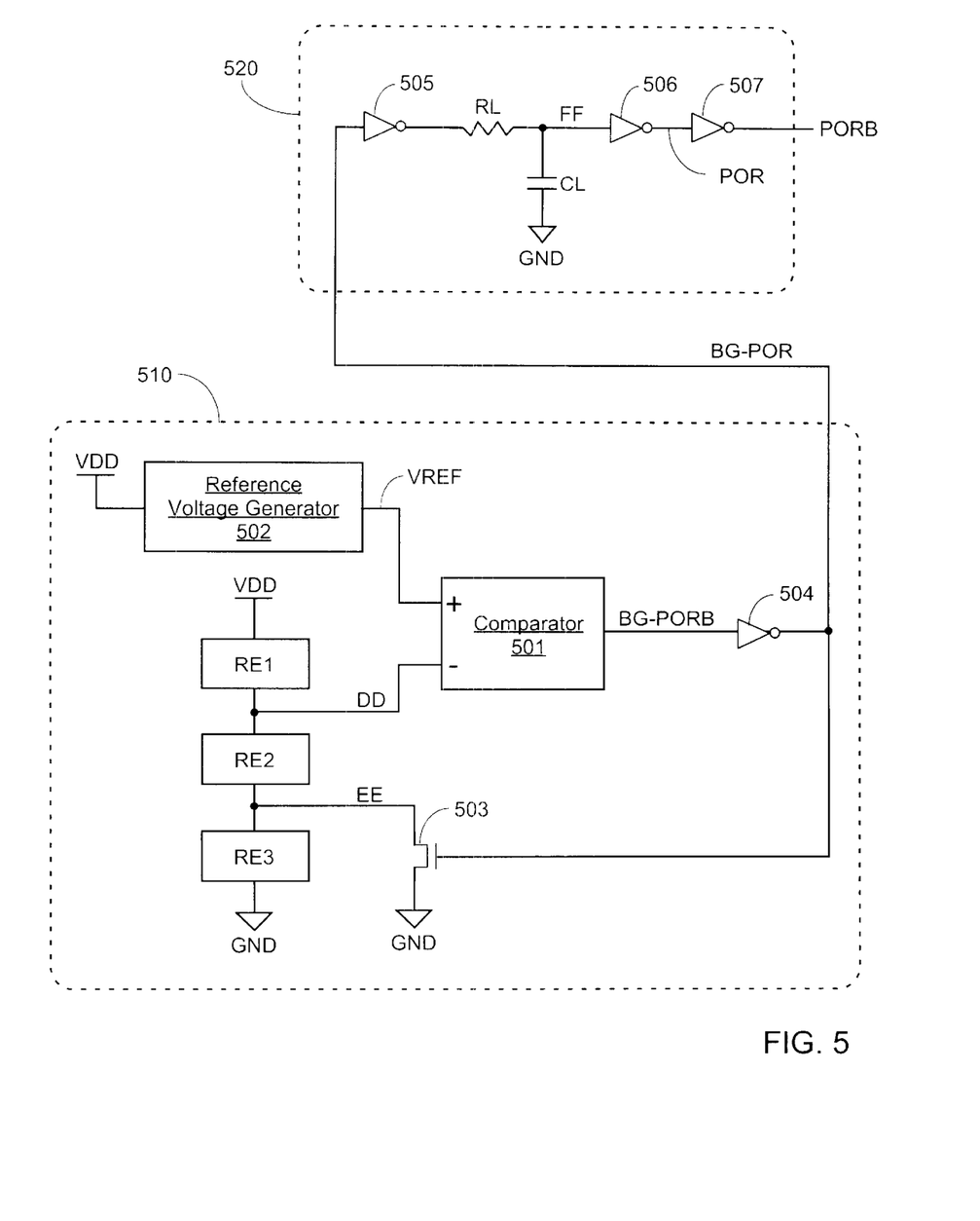
FIG. 5 shows a POR generator circuit according to a first embodiment of the invention.

FIG. 5 shows a first embodiment of the invention that addresses the shortcomings of the circuits of FIGS. 2–4. The POR circuit shown in FIG. 5 includes a bandgap POR circuit 510 driving an RC POR circuit 520. The input terminal of RC POR circuit 520 is supplied by a bandgap output signal BG-POR from bandgap POR circuit 510 through inverter 505, rather than being tied through a pullup to VDD as in the circuit of FIG. 2. The output terminal of RC POR circuit 520 provides active-low POR signal PORB and/or active-high POR signal POR.

Bandgap POR circuit 510 includes a comparator 501 having positive and negative input terminals. Comparator 501 can be an analog comparator or a digital comparator. A reference voltage generator 502 supplies a reference voltage VREF (derived from VDD) to the positive input terminal of comparator 501. A voltage divider including resistive elements RE1 and RE2 is used to divide down power high VDD, and provide a predetermined fraction of the VDD voltage level (i.e., the voltage at node DD) to the negative input terminal of comparator 501.

Optionally included in the voltage divider are a pulldown 503 and a third resistive element RE3 located between the second resistive element and ground. Pulldown 503 is applied to the node EE between the second and third resistive elements. In the pictured embodiment, pulldown 503 is implemented as an N-channel transistor coupled between node EE and ground. The control terminal of pulldown 503 is coupled to the output terminal BG-POR of bandgap POR circuit 510.

When pulldown 503 is on, resistive element RE3 is bypassed, and the voltage at node DD is [(RE2)/(RE1+RE2)]*VDD, or the ratio of RE2 to (RE1 plus RE2), multiplied by VDD. When pulldown 503 is off, resistive element RE3 is no longer bypassed, and the voltage at node DD is [(RE2+RE3)/(RE1+RE2+RE3)]*VDD, or the ratio of (RE2 plus RE3) to (RE1 plus RE2 plus RE3), multiplied by VDD.

Comparator 501 provides active-low POR output signal BG-PORB, which is inverted by inverter 504 to provide signal BG-POR to pulldown 503 and to the RC portion 520 of the POR circuit.

In another embodiment (not shown), reference voltage VREF is applied to the negative terminal of comparator 501 and node DD is applied to the positive terminal, while comparator 501 includes an additional inverter on the output path. This substitution provides a logically equivalent circuit, as will be understood by those of skill in the relevant arts.

The RC portion 520 of the POR circuit of FIG. 5 includes an inverter 505, a resistor RL, a capacitor CL, and a buffer circuit that includes inverters 506–507. The number of inverters on the output path varies according to whether an active-low or active-high output signal is desired. In the pictured circuit, a low value on the output signal PORB resets the associated circuits.

Inverter 505, resistor RL, and inverters 506–507 are coupled sequentially between the BG-POR terminal and an output terminal PORB. The node FF between resistor RL and inverter 506 is also coupled through capacitor CL to ground GND. Inverter 506 provides an active-high POR signal POR. Inverter 507 provides the active-low output signal PORB.

The POR generator circuit of FIG. 5 functions as follows. Signal BG-PORB is initially low, as with the circuit of FIG. 3A, and signal BG-POR is high. Thus, inverter 505 drives node FF low, i.e., discharges capacitor CL through resistor RL. Hence, output node PORB is also low (active). When node DD rises above reference voltage VREF, signal BG-PORB goes high, signal BG-POR goes low, and inverter 505 begins to charge up capacitor CL through resistor RL. When capacitor CL is sufficiently charged, node FF trips inverter 506, signal POR goes low, and output signal PORB goes high. (inactive).

Because the RC circuit is coupled in series after the bandgap POR circuit, rather than in parallel as shown in FIG. 4, the POR circuit of FIG. 5 functions as just described at fast, intermediate, slow, and very slow ramp up rates. In addition, the circuit of FIG. 5 has a reduced sensitivity to noise on power high VDD, as is now described.

As described above in connection with FIG. 4A, at slow ramp rates a noisy VDD results in a noisy node DD, which can repeatedly cross the VREF value and generate short pulses on signal BG-PORB. However, in the circuit of FIG. 5, these short pulses do not result in pulses on the output signal PORB, because they are absorbed by capacitor CL. In other words, output signal PORB only goes high after capacitor CL is charged up, and capacitor CL only becomes charged up after the small discharging pulses (i.e., the glitches on signal BG-PORB) have ceased.

Figure 5A:
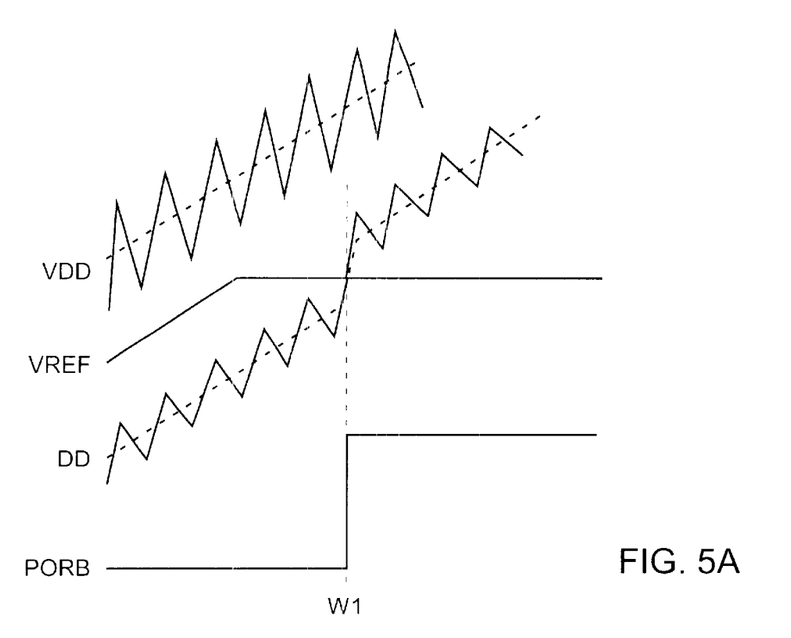
FIG. 5A illustrates how the pulldown included in the embodiment of FIG. 5 provides protection from glitches at a first level of noise on the power supply.

FIG. 5A illustrates how the optional pulldown included in the embodiment of FIG. 5 provides even more protection from glitches at a first level of noise on the power supply. Initially, signal BG-POR is high, and pulldown 503 is on. Thus, resistive element RE3 is bypassed by pulldown 503. The voltage at node DD is [RE2/(RE1+RE2)]*VDD.

At time W1, node DD rises above reference voltage VREF. In response, signal BG-PORB goes high, signal BG-POR goes low, and pulldown 503 turns off. Resistive element RE3 is no longer bypassed by pulldown 503, and the voltage at node DD rises to [(RE2+RE3)/(RE1+RE2+RE3)]*VDD. This rise in the voltage at node DD is shown in FIG. 5A as an offset in the nominal voltage level of node DD (the voltage level without noise, shown as a dashed line in FIG. 5A). This offset raises the nominal voltage level at node DD to the point where the next glitch down on node DD does not fall below the reference voltage VREF. Therefore, output signal PORB does not go low again, and does not trigger a new power up reset sequence.

Figure 5B:
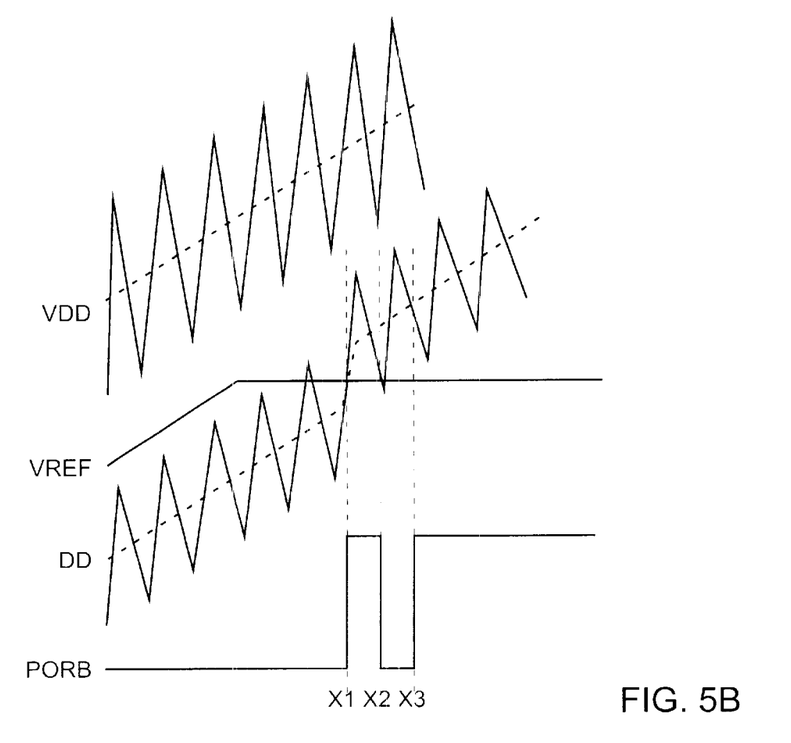
FIG. 5B illustrates how the pulldown and RC circuit included in the embodiment of FIG. 5 provide protection from glitches at a higher level of noise on the power supply.

The waveforms shown in FIG. 5A show how the circuit of FIG. 5 behaves when the noise on power high VDD is within certain limits, e.g., within the limits specified for the device. FIG. 5B provides an example of how the RC portion of the circuit can still provide some protection when the noise on power high VDD reaches even higher levels.

Comparing the waveforms of FIGS. 5A and 5B, it can be seen that the VDD noise level is higher in FIG. 5B. Because node DD is merely a divided down version of VDD, this higher noise level is also translated to node DD, as shown. In this example, after the offset occurs at time X1 (as described with reference to FIG. 5A, above), the added noise on node DD causes the node to glitch below reference voltage VREF at time X2. Thus, signal PORB goes low and another power up reset sequence is triggered.

Without the RC portion 520 of the circuit of FIG. 5, signal PORB would go high again almost immediately, when node DD rises again above the VREF line. However, the RC portion of the circuit delays the next rising edge of the PORB signal until time X3. This delay provides sufficient time for the device to complete the power up reset sequence.

Figure 6:
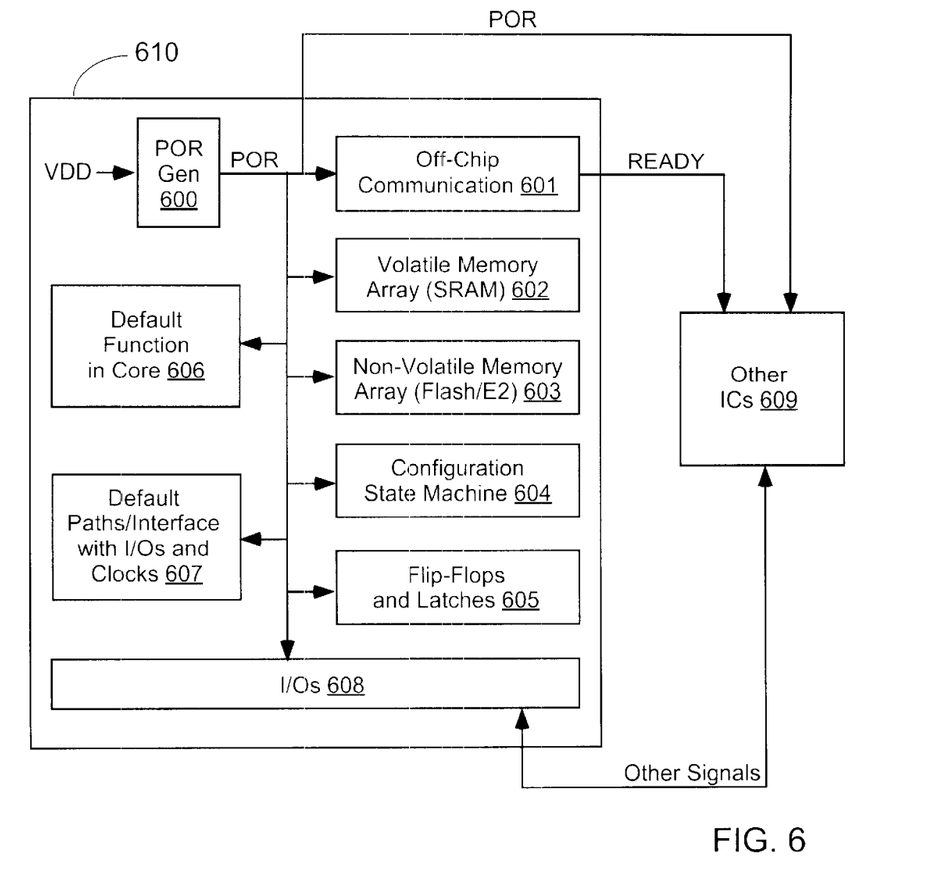
FIG. 6 shows a system that includes a POR generator circuit in a PLD according to a second embodiment of the invention.

FIG. 6 shows a system that includes a POR generator circuit according to a second embodiment of the invention. The exemplary system includes a programmable logic device (PLD) 610 and other integrated circuits (ICs) 609. PLD 610 provides a POR signal to the other ICs 609. A system with a single POR signal provided by a PLD has several advantages. For example, the POR signal can be made programmable, having, for example, programmable capacitance or resistive values, or a programmable reference voltage. It is also desirable for each component in a system to become operational at the same time, a goal that is more easily accomplished when all components are responsive to a single POR signal.

In the pictured system, the PLD also provides a READY signal to the other ICs. While the POR signal initiates a reset sequence, the READY signal indicates that the reset sequence in the PLD is complete, and the other ICs can begin communications with the PLD via the "Other Signals" shown in FIG. 6.

PLD 610 of FIG. 6 includes a configuration memory array, a configuration state machine 604, and a power on reset generator circuit 600. POR generator circuit 600 provides a POR signal "POR" to the configuration memory array and state machine, as well as to the other ICs in the system. In the pictured embodiment, the PLD is a CPLD, and the configuration memory array includes a non-volatile memory array 603 and a volatile memory array 602. During the reset sequence, configuration data is loaded from non-volatile memory array 603 into volatile memory array 602 under the control of configuration state machine 604. POR generator circuit 600 can be, for example, the circuit of FIG. 5.

PLD 610 also optionally includes other circuits coupled to receive the POR signal from the POR generator circuit. These circuits can include, for example, default functions 606 in the core of the PLD, default paths and interfaces with I/Os and clocks 607, input/output logic blocks 608, an off-chip communications module 601 that provides the READY signal to the other ICs in the system, and flip-flops and latches 605 scattered throughout the PLD.

Those having skill in the relevant arts of the invention will now perceive various modifications and additions that can be made as a result of the disclosure herein. For example, the above text describes the circuits and methods of the invention in the context of programmable logic devices (PLDs) such as CPLDs and FPGAs. However, the POR circuits described herein can also be implemented in non-programmable devices, ICs, and systems.

Further, resistors, capacitors, resistive elements, pulldowns, transistors, comparators, buffers, inverters, RC circuits, RC POR circuits, bandgap POR circuits, reference voltage generators, and other components other than those described herein can be used to implement the invention. Active-high signals can be replaced with active-low signals by making straightforward alterations to the circuitry, such as are well known in the art of circuit design.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A power on reset (POR) generator circuit, comprising:
a reference voltage input terminal;
a bandgap POR circuit having an input terminal coupled to the reference voltage input terminal and further having an output terminal;
an RC POR circuit having an input terminal coupled to the output terminal of the bandgap POR circuit and further having an output terminal; and
a POR output terminal coupled to the output terminal of the RC POR circuit,
wherein the bandgap POR circuit comprises:
 a comparator circuit having a first input terminal, a second input terminal, and an output terminal, the first input terminal being coupled to the reference voltage input terminal;
 a first node coupled to the second input terminal of the comparator circuit;
 first and second resistive elements coupled in series between a power high VDD and a ground, the first resistive element being coupled between the VDD and the first node, the second resistive element being coupled between the first node and the ground;
 a third resistive element coupled between the second resistive element and the ground, the second and third resistive elements having a second node therebetween; and
 a pulldown circuit coupled between the second node and the ground, the pulldown circuit having a control terminal coupled to the output terminal of the comparator circuit.

2. A power on reset (POR) generator circuit, comprising:
a reference voltage input terminal;
a bandgap POR circuit having an input terminal coupled to the reference voltage input terminal and further having an output terminal;
an RC POR circuit having an input terminal coupled to the output terminal of the bandgap POR circuit and further having an output terminal; and
a POR output terminal coupled to the output terminal of the RC POR circuit,
wherein the RC POR circuit comprises:
 a third node;
 a resistor coupled between the output terminal of the bandgap POR circuit and the third node,
 a capacitor coupled between the third node and a ground; and
 a buffer circuit coupled between the third node and the output terminal of the RC POR circuit.

3. A power on reset (POR) generator circuit, comprising:
a comparator circuit having a first input terminal, a second input terminal, and an output terminal;
a reference voltage input terminal coupled to the first input terminal of the comparator circuit;
a first node coupled to the second input terminal of the comparator circuit;
first and second resistive elements coupled in series between a power high VDD and a ground, the first resistive element being coupled between the VDD and the first node, the second resistive element being coupled between the first node and the ground;
a third node;
a resistor coupled between the output terminal of the comparator circuit and the third node;
a capacitor coupled between the third node and the ground;
a POR output terminal; and
a buffer circuit coupled between the third node and the POR output terminal.

4. The POR generator circuit of claim 3, further comprising:
a third resistive element coupled between the second resistive element and the ground, the second and third resistive elements having a second node therebetween; and
a pulldown circuit coupled between the second node and the ground, the pulldown circuit having a control terminal coupled to the output terminal of the comparator circuit.

5. The POR generator circuit of claim 4, wherein:
the POR generator circuit further comprises first and second inverters;
the control terminal of the pulldown circuit is coupled to the output terminal of the comparator circuit through the first inverter; and
the resistor is coupled to the output terminal of the comparator circuit through the first inverter and the second inverter.

6. The POR generator circuit of claim 3, further comprising a reference voltage generator circuit coupled to the VDD and further having an output terminal coupled to the reference voltage input terminal.

7. The POR generator circuit of claim 3, wherein the buffer circuit comprises two inverters coupled in series.

8. The POR generator circuit of claim 3, wherein the first input terminal of the comparator circuit is a positive input terminal, and the second input terminal of the comparator circuit is a negative input terminal.

9. A programmable logic device (PLD), comprising:
a configuration memory array having a power on reset (POR) input terminal;
a configuration state machine having a POR input terminal;
a power high VDD input terminal; and
a POR generator circuit, comprising:
 a comparator circuit having a first input terminal, a second input terminal, and an output terminal;
 a reference voltage generator circuit having an input terminal coupled to the power high VDD input terminal and further having an output terminal coupled to the first input terminal of the comparator circuit;
 a first node coupled to the second input terminal of the comparator circuit;
 first and second resistive elements coupled in series between a power high VDD and a ground, the first resistive element being coupled between the VDD and the first node, the second resistive element being coupled between the first node and the ground;

a third node;

a resistor coupled between the output terminal of the comparator circuit and the third node;

a capacitor coupled between the third node and the ground;

a POR output terminal coupled to the POR input terminals of the configuration memory array and the configuration state machine; and a buffer circuit coupled between the third node and the POR output terminal.

10. The PLD of claim 9, wherein the POR generator circuit further comprises:

a third resistive element coupled between the second resistive element and the ground, the second and third resistive elements having a second node therebetween; and a pulldown circuit coupled between the second node and the ground, the pulldown circuit having a control terminal coupled to the output terminal of the comparator circuit.

11. The PLD of claim 10, wherein:

the POR generator circuit further comprises first and second inverters;

the control terminal of the pulldown circuit is coupled to the output terminal of the comparator circuit through the first inverter; and the resistor is coupled to the output terminal of the comparator circuit through the first inverter and the second inverter.

12. The PLD of claim 9, wherein the buffer circuit comprises two inverters coupled in series.

13. The PLD of claim 9, wherein the configuration memory array comprises a volatile memory array and a non-volatile memory array, each having a POR input terminal coupled to the POR output terminal of the POR generator circuit.

14. The PLD of claim 9, further comprising a plurality of flip-flops and latches having input terminals coupled to the POR output terminal of the POR generator circuit.

15. The PLD of claim 9, further comprising a plurality of input/output logic blocks having input terminals coupled to the POR output terminal of the POR generator circuit.

16. The PLD of claim 9, further comprising a plurality of default logic functions and paths having input terminals coupled to the POR output terminal of the POR generator circuit.

17. The PLD of claim 9, further comprising an off-chip communications circuit having an input terminal coupled to the POR output terminal of the POR generator circuit.

18. The PLD of claim 9, wherein the first input terminal of the comparator circuit is a positive input terminal, and the second input terminal of the comparator circuit is a negative input terminal.

19. A system, comprising:

an integrated circuit having a power on reset (POR) input terminal; and a programmable logic device (PLD), comprising:

a configuration memory array having a POR input terminal;

a configuration state machine having a POR input terminal;

a power high VDD input terminal; and a POR generator circuit having an input terminal coupled to the power high VDD input terminal and a POR output terminal coupled to the POR input terminals of the configuration memory array, the configuration state machine, and the integrated circuit.

20. The system of claim 19, wherein:

the PLD further comprises an off-chip communication circuit having an input terminal coupled to the POR output terminal of the POR generator circuit and a ready output terminal; and the integrated circuit further has a ready input terminal coupled to the ready output terminal of the PLD.

21. The system of claim 19, wherein the configuration memory array comprises a volatile memory array and a non-volatile memory array, each having a POR input terminal coupled to the POR output terminal of the POR generator circuit.

22. The system of claim 19, wherein the PLD further comprises a plurality of flip-flops and latches having input terminals coupled to the POR output terminal of the POR generator circuit.

23. The system of claim 19, wherein the PLD further comprises a plurality of input/output logic blocks having input terminals coupled to the POR output terminal of the POR generator circuit.

24. The system of claim 19, wherein the PLD further comprises a plurality of default logic functions and paths having input terminals coupled to the POR output terminal of the POR generator circuit.

25. The system of claim 19, wherein the POR generator circuit comprises:

a comparator circuit having a first input terminal, a second input terminal, and an output terminal;

a reference voltage generator circuit having an input terminal coupled to the input terminal of the POR generator circuit and further having an output terminal coupled to the first input terminal of the comparator circuit;

a first node coupled to the second input terminal of the comparator circuit;

first and second resistive elements coupled in series between a power high VDD and a ground, the first resistive element being coupled between the VDD and the first node, the second resistive element being coupled between the first node and the ground;

a third node;

a resistor coupled between the output terminal of the comparator circuit and the third node;

a capacitor coupled between the third node and the ground; and a buffer circuit coupled between the third node and the POR output terminal of the POR generator circuit.

26. The system of claim 25, wherein the POR generator circuit further comprises:

a third resistive element coupled between the second resistive element and the ground, the second and third resistive elements having a second node therebetween; and a pulldown circuit coupled between the second node and the ground, the pulldown circuit having a control terminal coupled to the output terminal of the comparator circuit.

27. The system of claim 26, wherein:

the POR generator circuit further comprises first and second inverters;

the control terminal of the pulldown circuit is coupled to the output terminal of the comparator circuit through the first inverter; and the resistor is coupled to the output terminal of the comparator circuit through the first inverter and the second inverter.

* * * * *